(12) United States Patent
Mao et al.

(10) Patent No.: US 10,386,944 B2
(45) Date of Patent: Aug. 20, 2019

(54) CAPACITIVE STYLUS PROVIDING SIGNALS FOR TILT AND ORIENTATION DETECTION

(71) Applicant: WALTOP INTERNATIONAL CORPORATION, Hsinchu (TW)

(72) Inventors: Chung-Fuu Mao, Hsinchu (TW); Hsin-Chiang Ho, Hsinchu (TW)

(73) Assignee: Waltop International Corporation, Hsinchu (TW)

( * ) Notice: Subject to any disclaimer, the term of this patent is extended or adjusted under 35 U.S.C. 154(b) by 18 days.

(21) Appl. No.: 15/789,492

(22) Filed: Oct. 20, 2017

(65) Prior Publication Data
US 2019/0033990 A1 Jan. 31, 2019

(30) Foreign Application Priority Data
Jul. 31, 2017 (TW) .............................. 106125659 A

(51) Int. Cl.
G06F 3/038 (2013.01)
H05K 1/18 (2006.01)
H05K 1/02 (2006.01)
G06F 3/0354 (2013.01)

(52) U.S. Cl.
CPC ........ *G06F 3/0383* (2013.01); *G06F 3/03545* (2013.01); *H05K 1/0216* (2013.01); *H05K 1/181* (2013.01); *H05K 1/189* (2013.01); *H05K 1/0224* (2013.01); *H05K 2201/0145* (2013.01); *H05K 2201/0195* (2013.01); *H05K 2201/0723* (2013.01); *H05K 2201/10151* (2013.01); *H05K 2201/10265* (2013.01)

(58) Field of Classification Search
CPC ... G06F 3/03545; G06F 3/03546; G06F 3/044
See application file for complete search history.

(56) References Cited

U.S. PATENT DOCUMENTS

| 2014/0104188 A1* | 4/2014 | Bakken | G06F 3/044 345/173 |
| 2015/0309598 A1* | 10/2015 | Zeliff | G06F 3/03545 345/179 |
| 2018/0120958 A1* | 5/2018 | Yeh | G06F 3/03545 |

* cited by examiner

Primary Examiner — Vijay Shankar
Assistant Examiner — Cory A Almeida
(74) Attorney, Agent, or Firm — Donald E. Stout; Stout, Uxa & Buyan, LLP

(57) ABSTRACT

A capacitive stylus capable of providing signals for tilt and orientation detection is provided. The capacitive stylus is used for a tablet or a touch panel. The capacitive stylus can emit two high voltage waves, and the tablet or the touch panel receives the two high voltage waves and determines a tilt angle and an orientation of the capacitive stylus according to the two high voltage waves. This capacitive stylus has configuration allowing the tilt and orientation detection to be precise.

10 Claims, 8 Drawing Sheets

US 10,386,944 B2

CAPACITIVE STYLUS PROVIDING SIGNALS FOR TILT AND ORIENTATION DETECTION

CROSS-REFERENCE TO RELATED APPLICATIONS

The entire contents of Taiwan Patent Application No. 106125659, filed on Jul. 31, 2017, from which this application claims priority, are expressly incorporated herein by reference.

BACKGROUND OF THE INVENTION

1. Field of the Invention

The present invention relates to a capacitive stylus, and more particularly relates to a capacitive stylus capable of providing signals for tilt and orientation detection.

2. Description of Related Art

Digitizer systems typically include a tablet and a stylus. A user interacts with the digitizer system by positioning (or hovering) and moving the stylus over a sensing surface (e.g., touch panel) of the tablet, and position of the stylus with respect to the sensing surface is tracked by the digitizer system and interpreted as a user command and/or used to form a stroke on the sensing surface.

To increase visual effects, stylus pens with tilt and orientation detection function are developed. The tilt and orientation of the stylus are calculated by the tablet and turned into grayscale and thickness of the strokes. The tilt may be defined as an angle between the stylus and normal vector of the sensing surface, and the orientation (azimuth) is an angle between the projected vector of the stylus and a reference vector on the reference plane (sensing surface).

Typically the stylus is designed to provide multiple signals, allowing the digitizer system to receive and calculate the tilt and orientation of the stylus.

A problem to be resolved is that a signal emitted from the stylus could be interfered by other signals or noises, resulting from fluctuation of the signal. The digitizer system needs complex algorithm to exclude the fluctuation and correctly calculate the tilt and the orientation of the stylus.

SUMMARY OF THE INVENTION

In one general aspect, the present invention relates to a capacitive stylus capable of providing signals for tilt and orientation detection.

According to an aspect of this invention, a capacitive stylus capable of providing signals for tilt and orientation detection on a tablet or a touch panel is provided with a control circuit board, a pin, a signal-transmitting spring, a first insulating sheet, a shielding layer, a second insulating sheet, and a signal emitter. A micro controller is mounted on the control circuit board. The pin electrically connects with the control circuit board, and the micro controller instructs a first high voltage to be emitted from the pin. The signal-transmitting spring comprises a bent portion and electrically connects with the control circuit board, and the micro controller instructs a second high voltage transmitted to the signal-transmitting spring. The first insulating sheet covers the signal-transmitting spring and comprises a first aperture. The shielding layer covers the first insulating sheet and comprises a second aperture, the shielding layer electrically connecting with a ground of the control circuit board. The second insulating sheet covers the shielding layer and comprises a third aperture. The signal emitter is arranged at the outside of the second insulating sheet. Wherein the bent portion of the signal-transmitting spring passes through the first aperture, the second aperture, and the third aperture, and the bent portion contacts the signal-emitter so that the second high voltage signal is emitted from the signal emitter.

In an embodiment, the signal emitter is hollow cylinder-shaped. In an embodiment, both the first insulating sheet and the second insulating sheet are made of a polymer, and the tablet or the touch panel receives the first high voltage signal and the second high voltage signal and calculates the tilt and orientation of the capacitive stylus according to the first high voltage signal and the second high voltage signal. In an embodiment, both the first insulating sheet and the second insulating sheet are Mylar sheet. In an embodiment, both the first insulating sheet and the second insulating sheet are made of polyethylene terephthalate (PET). In an embodiment, the shielding layer comprises an upper shielding layer and a lower shielding layer.

According to another aspect of this invention, a capacitive stylus capable of providing signals for tilt and orientation detection on a tablet or a touch panel is provided with a control circuit board, a pin, a signal-transmitting spring, a first insulating sheet, a shielding layer, an isolation sheet, and a signal emitter. A micro controller is mounted on the control circuit board. The pin electrically connects with the control circuit board, the micro controller instructing a first high voltage to be emitted from the pin. The signal-transmitting spring comprises a bent portion and electrically connects with the control circuit board, the micro controller instructing a second high voltage to be transmitted to the signal-transmitting spring. The first insulating sheet covers the signal-transmitting and comprises a first aperture. The shielding layer covers a portion of the first insulating sheet and electrically connects with a ground of the control circuit board. The signal emitter is arranged at the outside of the first insulating sheet. The isolation sheet isolates the shielding layer from the signal-emitter. Wherein the bent portion of the signal-transmitting spring passes through the first aperture and contacts the signal-emitter, allowing the second high voltage signal to be emitted from the signal emitter.

In an embodiment, the signal emitter is hollow cylinder-shaped. In an embodiment, both the first insulating sheet and the isolation sheet are made of a polymer, and the tablet or the touch panel receives the first high voltage signal and the second high voltage signal and calculates the tilt and orientation of the capacitive stylus according to the first high voltage signal and the second high voltage signal. In an embodiment, both the first insulating sheet and the isolation sheet are Mylar sheet. In an embodiment, both the first insulating sheet and the isolation sheet are made of polyethylene terephthalate (PET). In an embodiment, the shielding layer comprises an upper shielding layer and a lower shielding layer.

DETAILED DESCRIPTION OF THE PREFERRED EMBODIMENT

Figure 1:
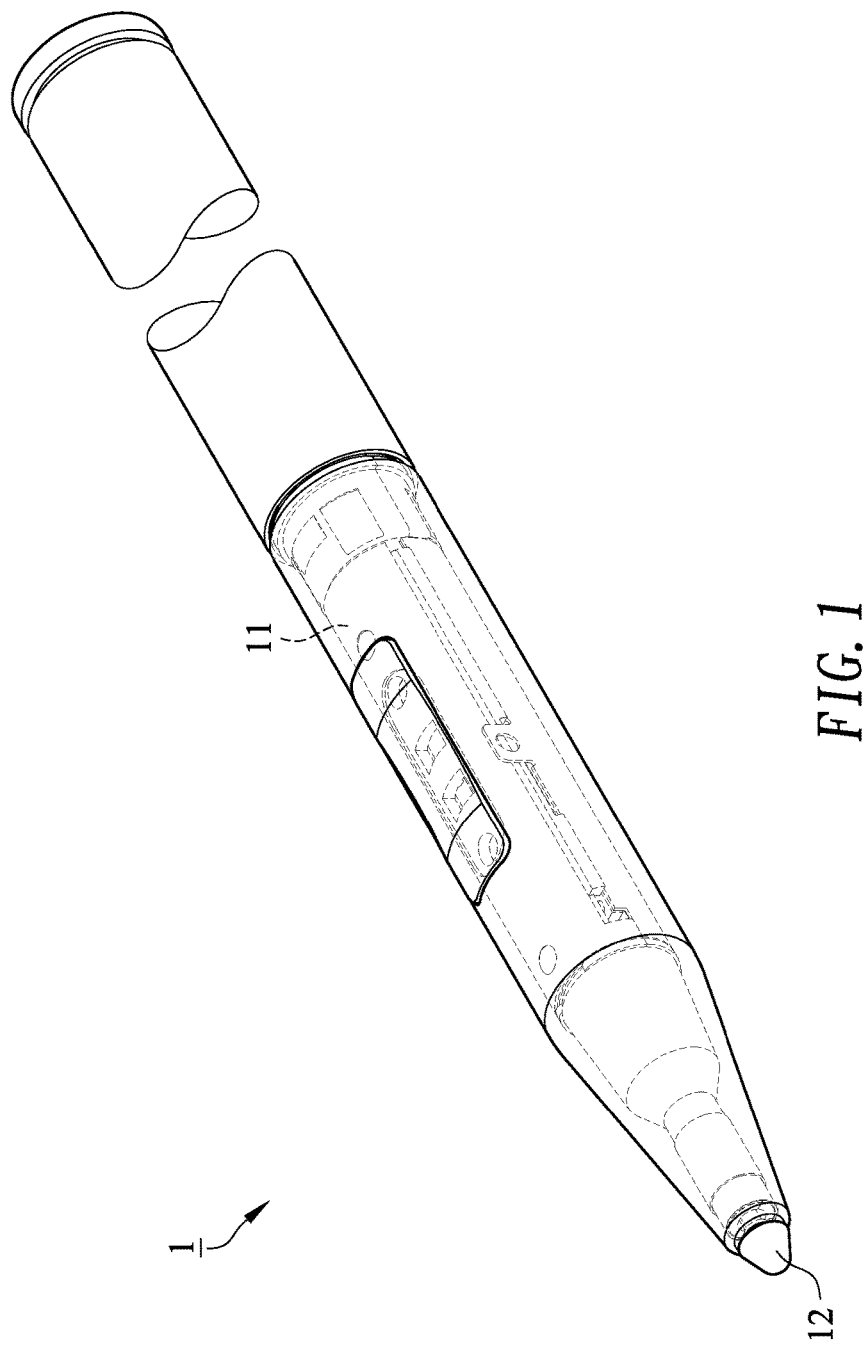
FIG. 1 is a perspective view showing a capacitive stylus capable of providing signals for tilt and orientation detection in accordance with a first embodiment of the present invention.

Embodiments of the invention are now described and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear, front, clockwise, and counterclockwise, are to be construed literally, while in other implementations the same use should not. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations and components are not described in detail in order not to unnecessarily obscure the present invention. While drawings are illustrated in detail, it is appreciated that the quantity of the disclosed components may be greater or less than that disclosed, except where expressly restricting the amount of the components.

Figure 2:
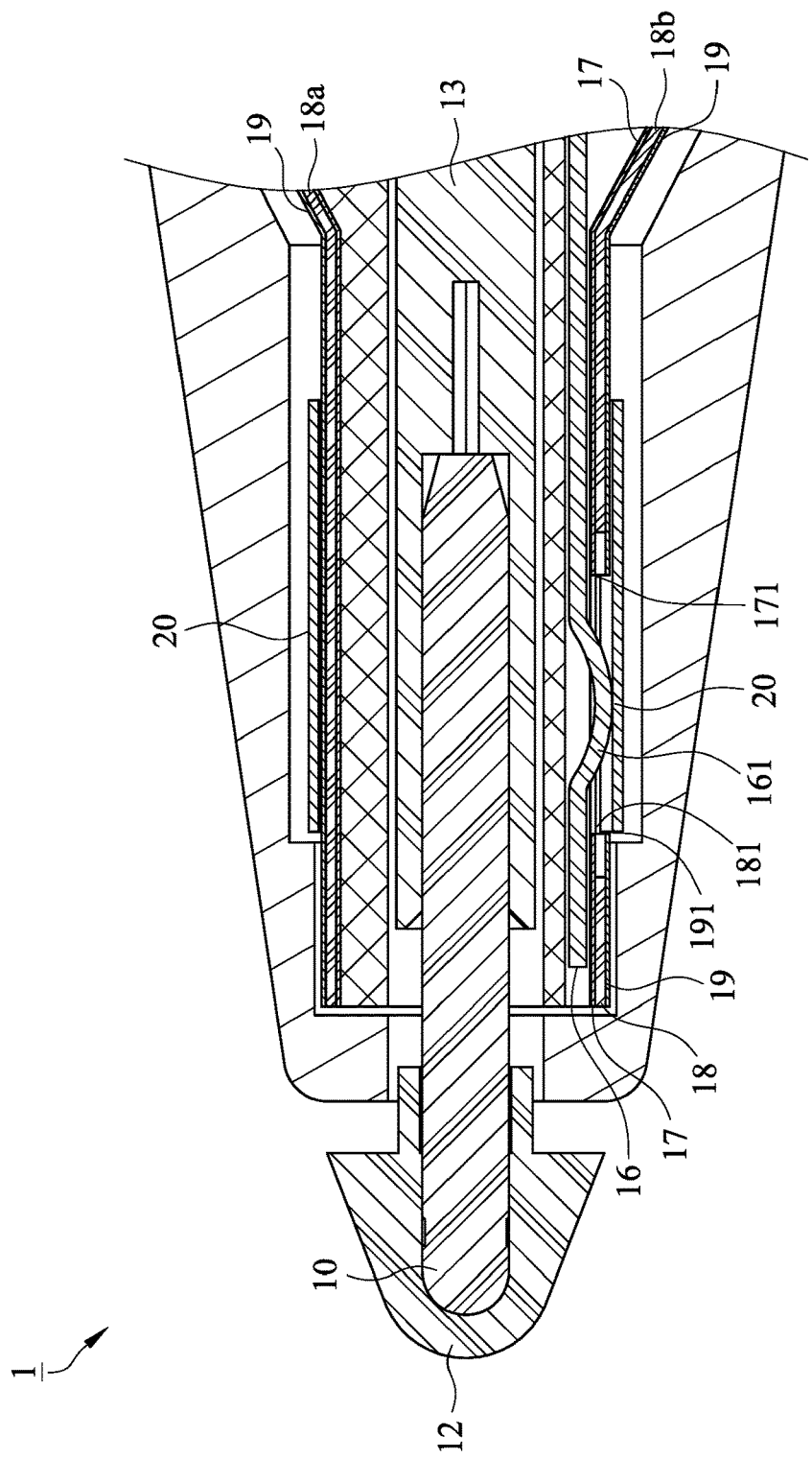
FIG. 2 is a partially cross-sectional view showing the capacitive stylus capable of providing signals for tilt and orientation detection in accordance with the first embodiment of the present invention.
Figure 3:
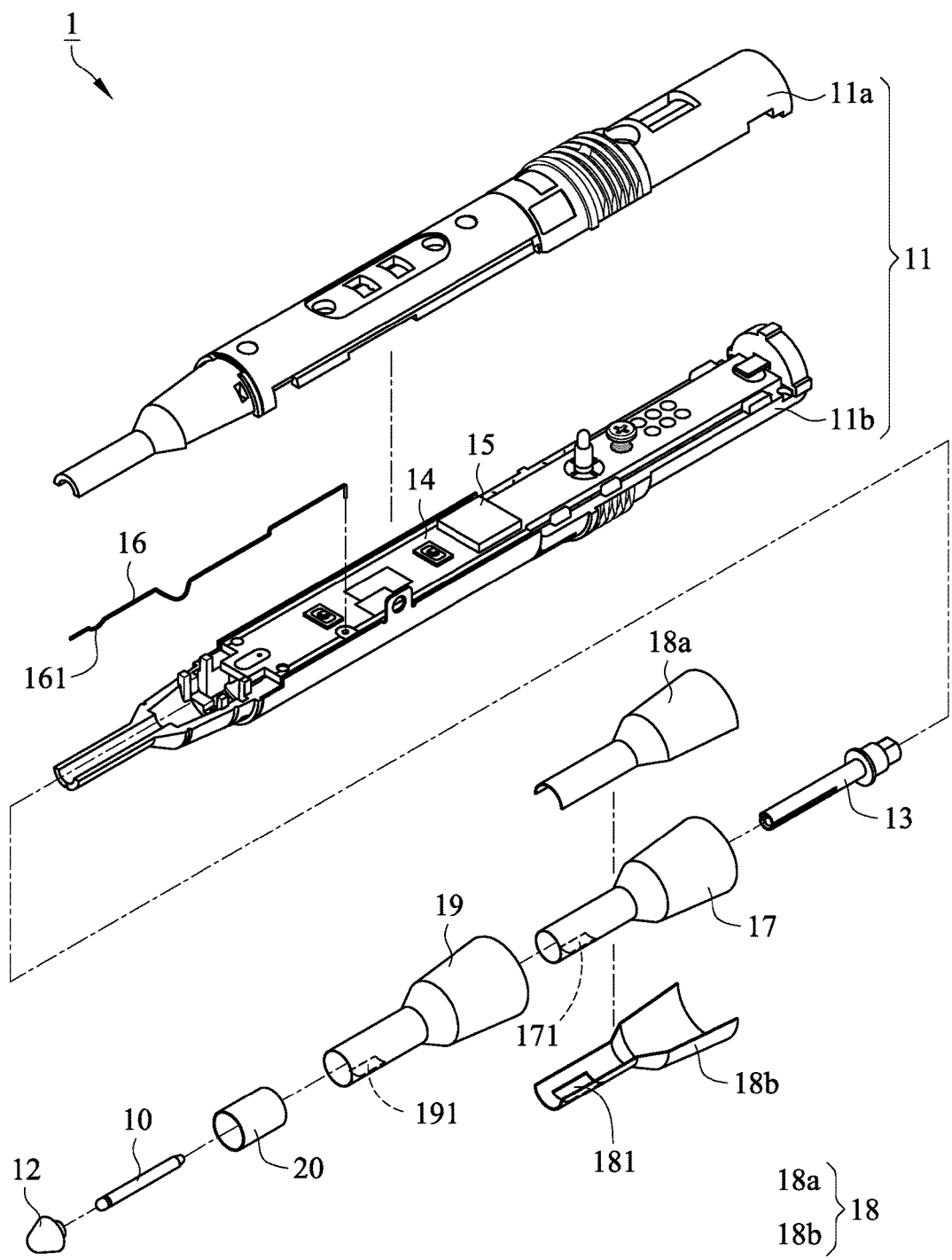
FIG. 3 is an exploded view showing the capacitive stylus capable of providing signals for tilt and orientation detection in accordance with the first embodiment of the present invention.
Figure 4:
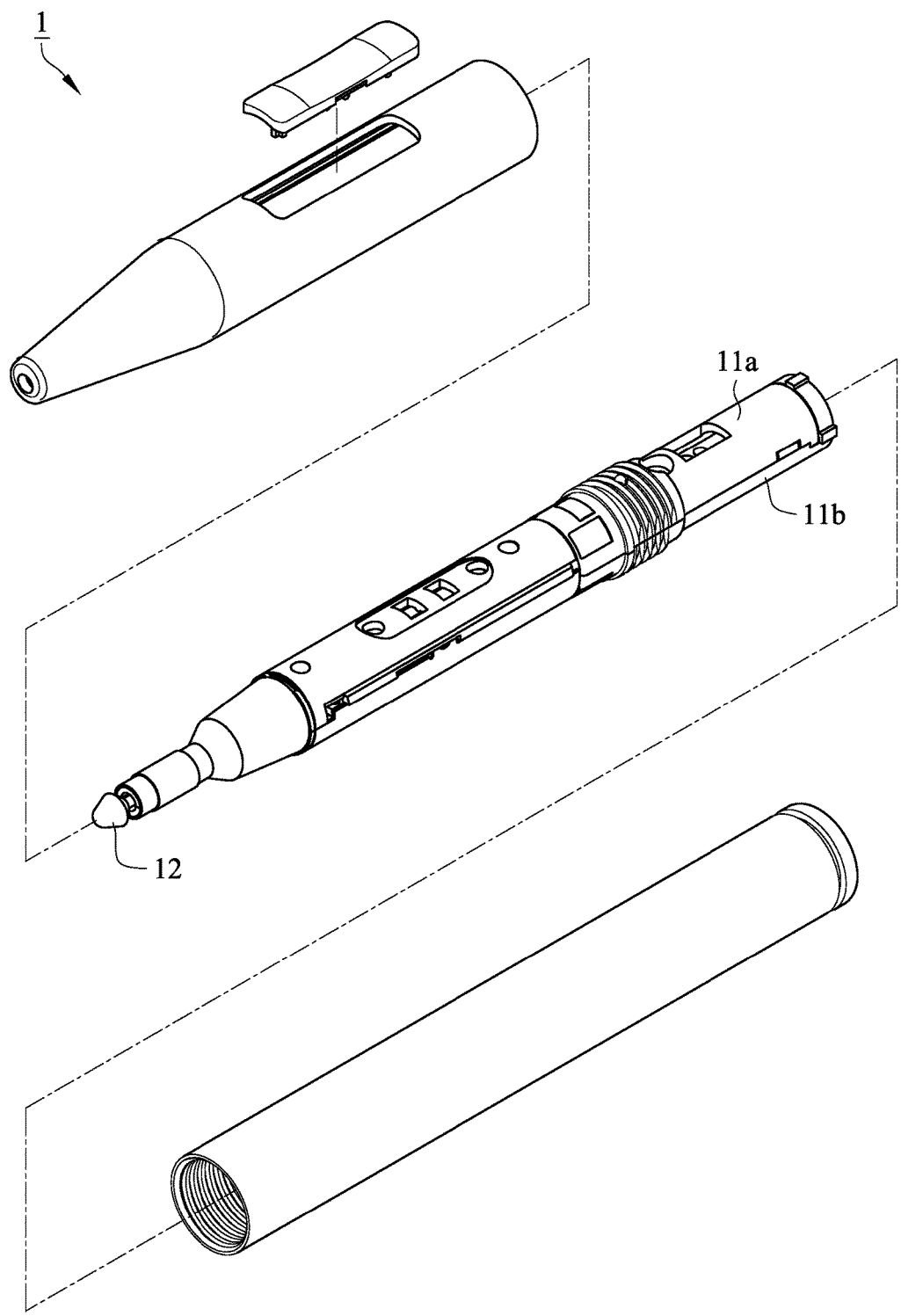
FIG. 4 is a perspective view showing the assembling of the capacitive stylus in accordance with the first embodiment of the present invention.

FIGS. 1, 2, 3, and 4 are perspective view, partially cross-sectional view, exploded view, and perspective view, respectively, showing a capacitive stylus 1 capable of providing signals for tilt and orientation detection in accordance with a first embodiment of the present invention.

Referring FIGS. 1-4, the capacitive stylus 1 mainly includes a pin 10 and a housing 11. The components of the capacitive stylus 1 are covered by the housing 11, which may include an upper housing 11a and a lower housing 11b.

The capacitive stylus 1 is used on a sensing surface or a touch panel of a tablet or a device. The sensing surface or the touch panel may include a capacitance-detecting array constructed by linear sensing electrodes. The linear sensing electrodes may be divided into transmit electrodes (Tx) and receive electrodes (Rx). When the capacitive stylus 1 contacts with or hovers over the sensing surface or the touch panel, a high voltage signal emitted from the pin 10 of the capacitive stylus 1 couples with the linear sensing electrodes at the location where the capacitive stylus 1 contacts with or hovers over the sensing surface or the touch panel, so that the capacitance between sensing electrodes will be locally altered. The transmit electrodes (Tx) and receive electrodes (Rx) are scanned to detect the capacitance change, and hence the position or the coordinate of the capacitive stylus can be determined.

By way of illustration, preferably, a front end of the pin 10 is covered by a tip cap 12, and a rear end of the pin 10 is inserted into a pin holder 13. The capacitive stylus 1 may include a pressure sensor (not shown) arranged at the rear of the pin holder 13. When using the capacitive stylus 1, the pin 10 can press the presser sensor via the pin holder 13, so as to detect the force that the capacitive stylus 1 exerted on the sensing surface of touch panel. In addition, the pin 10 electrically connects with a control circuit board 14 on which a micro controller 15 is mounted. The micro controller 15 can instruct a first high voltage signal to be emitted from the pin 10, and the first high voltage signal locally changes the capacitance by coupling with the linear sensing electrodes of the sensing surface or touch panel at the location where the capacitive stylus 1 contacts with or hovers over the sensing surface or the touch panel. The tablet detects the capacitance change and calculates the position coordinate of the capacitive stylus.

Referring to FIGS. 1-4, the pin 10 of the capacitive stylus 1 can emit the first high voltage signal to be used for detecting the coordinate of the capacitive stylus 1. In addition, the capacitive stylus 1 further include a signal-transmitting spring 16 electrically connected with the control circuit board 14. The micro controller 15 of the control circuit board 14 can instruct a second high voltage signal emitted from the signal-transmitting spring 16.

However, other signals or noise waves could interfere with the second high voltage signal emitted from the signal-transmitting spring 16, resulting in the second high voltage signal unstable. The tablet or touch panel needs a complex method to analyze the unstable second high voltage signal; otherwise the tilt and the orientation of the capacitive stylus cannot be calculated.

Referring to FIGS. 1-4, the capacitive stylus 1 further includes a first insulating sheet 17, a shielding layer 18, and a second insulating sheet 19. Preferably, the first insulating sheet 17 and the second insulating sheet 19 are made of a polymer. Preferably, each of the first insulating sheet 17 and the second insulating sheet 19 is a so-called "Mylar" sheet, which is made of polyethylene terephthalate (PET). The shielding layer 18 is made of metal, which comprises an upper shielding layer 18a and a lower shielding layer 18b and electrically connects with a ground of the control circuit board 14. The first insulating sheet 17 and the second insulating sheet 19 have good flexibility and can fit the outline of the object (e.g., the upper housing 11a and the lower housing 11b) wrapped by them. Therefore, the first insulating sheet 17 and the second insulating sheet 19 may have a cylinder and/or cone configuration after the wrapping procedure. The first insulating sheet 17 covers the signal-transmitting spring 16. The shielding layer 18, including the upper shielding layer 18a and the lower shielding layer 18b, covers the first insulating sheet 17. The second insulating sheet 19 covers the shielding layer 18. That is to say, the shielding layer 18 is interposed between the first insulating sheet 17 and the second insulating sheet 19. The shielding layer 18 may have a cylinder and a cone configuration. In addition, a hollow cylinder-shaped signal emitter 20 is arranged at the outside of the second insulating sheet 19 and covers a portion of the second insulating sheet 19. The first insulating sheet 17 is used to isolate the signal-transmitting spring 16 from the shielding layer 18, and the second insulating sheet 19 is used to isolate the signal emitter 20 from the shielding layer 18.

Referring to FIGS. 1-4, furthermore, the signal-transmitting spring 16 comprises a bend portion 161, the first insulating sheet 17 comprises a first aperture 171, the lower shielding layer 18b of the shielding 18 comprises a second aperture 181, and the second insulating sheet 19 comprises a third aperture 191. The first aperture 171 corresponds to the second aperture 181 and the third aperture 191. The bend portion 161 exactly passes through the first aperture 171 of the first insulating sheet 17, the second aperture 181 of the shielding layer 18, and the third aperture 191 of the second insulating sheet 19, and then contacts the inner wall of the signal-emitter 20. By such arrangements, the second high voltage signal of the signal-emitting spring 16 can be emitted via the signal emitter 20.

Referring to FIGS. 1-4, by the foregoing components and arrangements, the shielding layer 18 can block noises generated by components or circuits of the capacitive stylus 1, and the first insulating sheet 17 and the second insulating sheet 19 can separate the signal-transmitting spring 16 from the shielding layer 18 to avoid it being grounded by the shielding layer 18. The tablet or the touch panel receives the first high voltage signal emitted from the pin 10 and the second high voltage signal emitted from the signal emitter 20. The tablet or the touch panel compares the first high voltage signal with the second high voltage signal, so as to determine the tilt and the orientation of the capacitive stylus 1. The second high voltage signal emitted from the hollow cylinder-shaped signal emitter 20 is stable and is particularly beneficial to easily and precisely calculate the tilt and orientation of the capacitive stylus.

Figure 5:
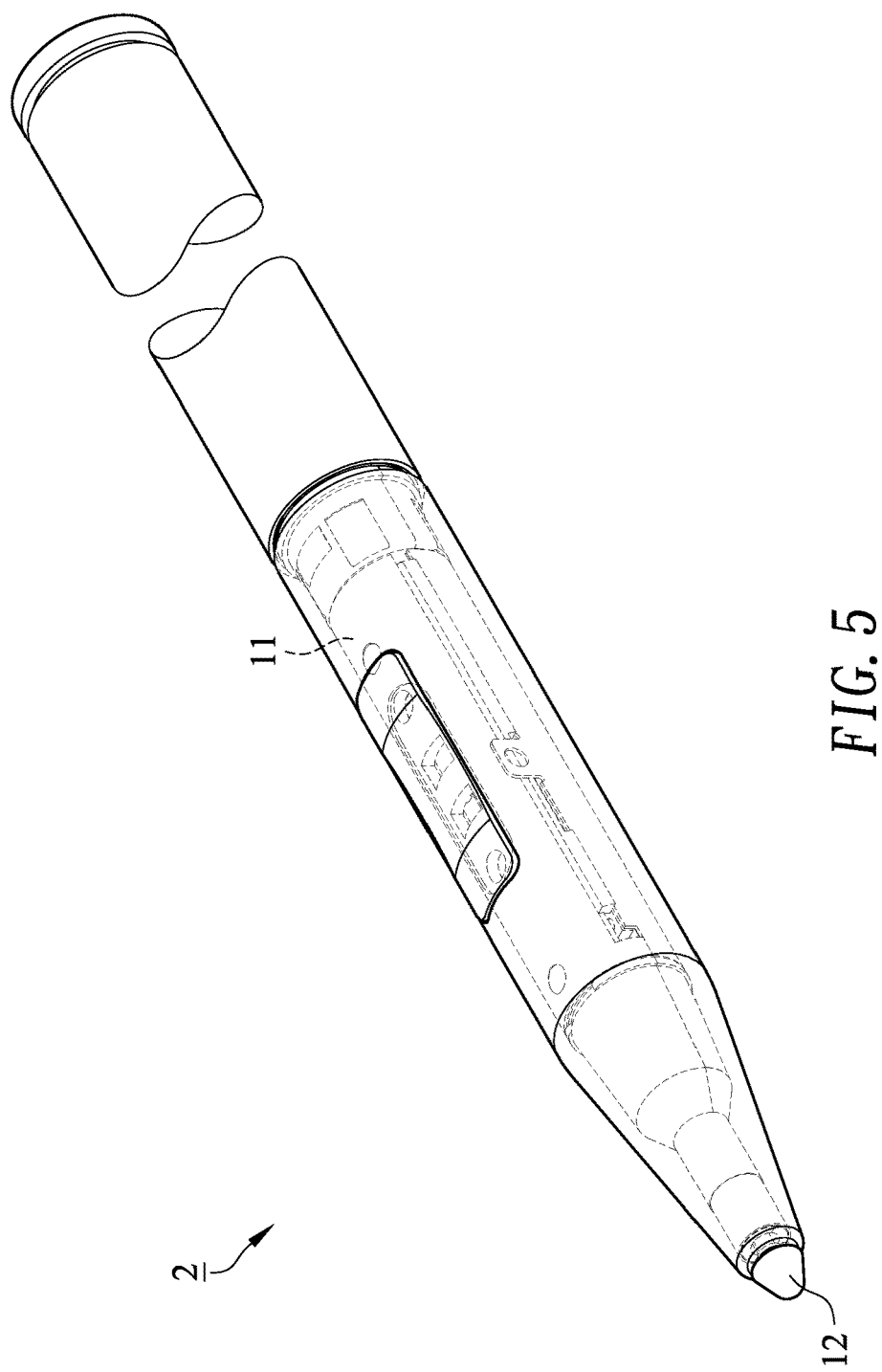
FIG. 5 is a perspective view showing a capacitive stylus capable of providing signals for tilt and orientation detection in accordance with a second embodiment of the present invention.
Figure 6:
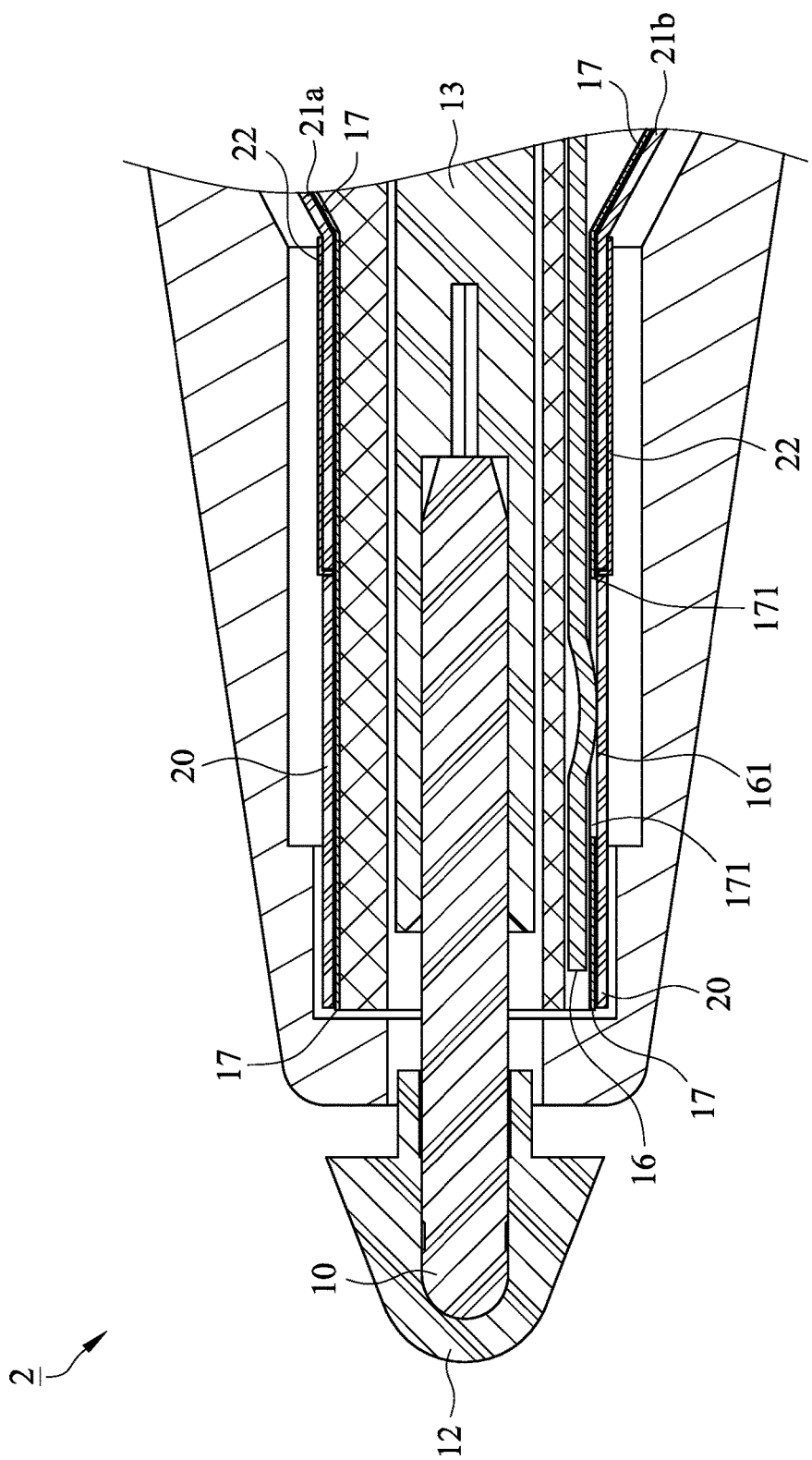
FIG. 6 is a partially cross-sectional view showing the capacitive stylus capable of providing signals for tilt and orientation detection in accordance with the second embodiment of the present invention.
Figure 7:
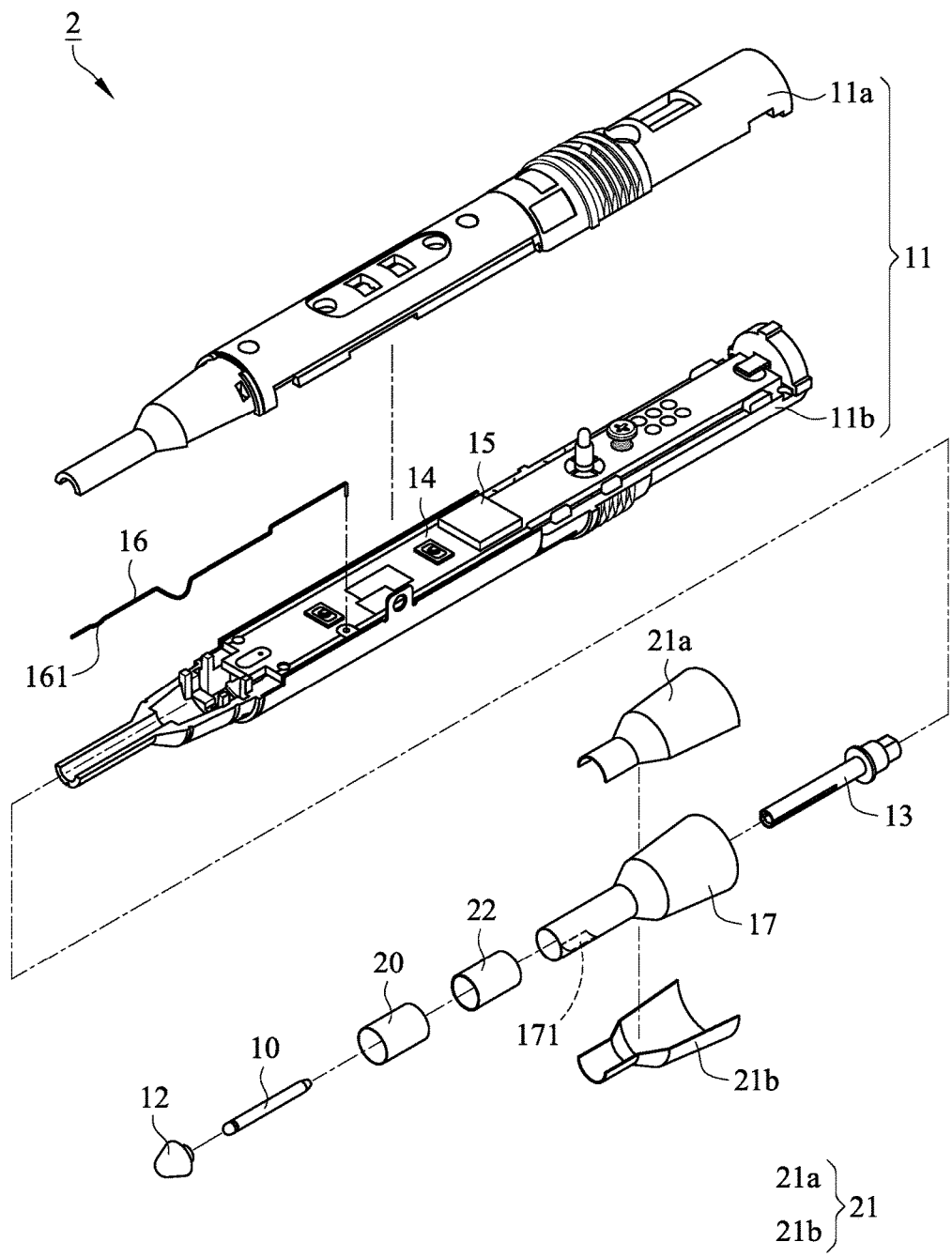
FIG. 7 is an exploded view showing the capacitive stylus capable of providing signals for tilt and orientation detection in accordance with the second embodiment of the present invention.
Figure 8:
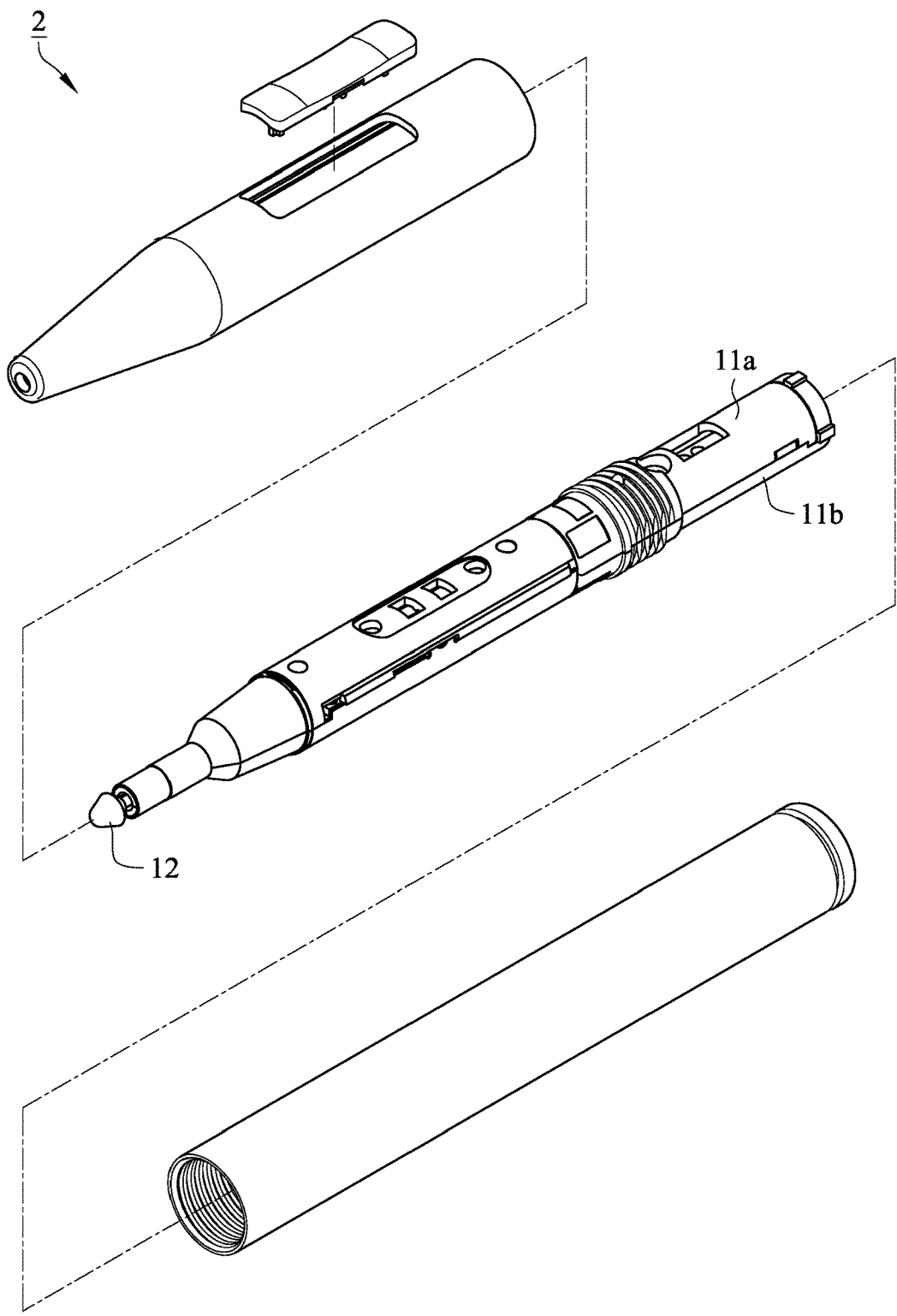
FIG. 8 is a perspective view showing the assembling of the capacitive stylus in accordance with the second embodiment of the present invention.

FIGS. 5, 6, 7, and 8 are perspective view, partially cross-sectional view, exploded view, and perspective view, respectively, showing a capacitive stylus 2 capable of providing signals for tilt and orientation detection in accordance with a second embodiment of the present invention.

For simplicity, the following description merely describes the difference between the first embodiment and the second embodiment. Referring to FIGS. 1-4, the shielding layer 18 of the first embodiment can cover a wide range of or whole signal-transmitting spring 16. Referring to FIGS. 5-8, the shielding layer 21, including an upper shielding layer 21a and a lower shielding layer 21b, covers a portion of signal-transmitting spring 16. The front portion of the signal-transmitting spring 16, including the bend portion 161, is not covered by the shielding layer 21. The lower shielding layer 21b does not include an aperture, and an isolation sheet 22 is used instead. The bend portion 161 of the signal-transmitting spring 16 passes through the first aperture 171 of the first insulating sheet 17, and then the bend portion 161 contacts the inner wall of the hollow cylinder-shaped signal emitter 20. The isolation sheet 22 is used to isolate the shielding layer 21 from the signal-emitter 20. Preferably, the isolation sheet 22 is made of a polymer. Preferably, the isolation sheet is a so-called "Mylar" sheet, which is made of polyethylene terephthalate (PET). By such arrangement, the second high voltage signal of the signal-transmitting spring 16 is emitted from the signal emitter 20.

Referring to FIGS. 5-8, by the foregoing components and arrangements, the shielding layer 18 can block noises generated by components or circuits of the capacitive stylus 2. The tablet or the touch panel receives the first high voltage signal emitted from the pin 10 and the second high voltage signal emitted from the signal emitter 20. The tablet or the touch panel compares the first high voltage signal with the second high voltage signal, so as to determine the tilt and the orientation of the capacitive stylus 1. The second high voltage signal emitted from the hollow cylinder-shaped signal emitter 20 is stable and is particularly beneficial to easily and precisely calculate the tilt and orientation of the capacitive stylus.

The intent accompanying this disclosure is to have each/all embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention. Corresponding or related structure and methods disclosed or referenced herein, and/or in any and all co-pending, abandoned or patented application(s) by any of the named inventor(s) or assignee(s) of this application and invention, are incorporated herein by reference in their entireties, wherein such incorporation includes corresponding or related structure (and modifications thereof) which may be, in whole or in part, (i) operable and/or constructed with, (ii) modified by one skilled in the art to be operable and/or constructed with, and/or (iii) implemented/made/used with or in combination with, any part(s) of the present invention according to this disclosure, that of the application and references cited therein, and the knowledge and judgment of one skilled in the art.

Conditional language, such as, among others, "can," "could," "might," or "may," unless specifically stated otherwise, or otherwise understood within the context as used, is generally intended to convey that embodiments include, and in other interpretations do not include, certain features, elements and/or steps. Thus, such conditional language is not generally intended to imply that features, elements and/or steps are in any way required for one or more embodiments, or interpretations thereof, or that one or more embodiments necessarily include logic for deciding, with or without user input or prompting, whether these features, elements and/or steps are included or are to be performed in any particular embodiment.

All of the contents of the preceding documents are incorporated herein by reference in their entireties. Although the disclosure herein refers to certain illustrated embodiments, it is to be understood that these embodiments have been presented by way of example rather than limitation. For example, any of the particulars or features set out or referenced herein, or other features, including method steps and techniques, may be used with any other structure(s) and process described or referenced herein, in whole or in part, in any combination or permutation as a non-equivalent, separate, non-interchangeable aspect of this invention. Corresponding or related structure and methods specifically contemplated and disclosed herein as part of this invention, to the extent not mutually inconsistent as will be apparent from the context, this specification, and the knowledge of one skilled in the art, including, modifications thereto, which may be, in whole or in part, (i) operable and/or constructed with, (ii) modified by one skilled in the art to be operable and/or constructed with, and/or (iii) implemented/made/used with or in combination with, any parts of the present invention according to this disclosure, include: (I) any one or more parts of the above disclosed or referenced structure and methods and/or (II) subject matter of any one or more of the inventive concepts set forth herein and parts thereof, in any permutation and/or combination, include the subject matter of any one or more of the mentioned features and aspects, in any permutation and/or combination.

Although specific embodiments have been illustrated and described, it will be appreciated by those skilled in the art that various modifications may be made without departing from the scope of the present invention, which is intended to be limited solely by the appended claims.

What is claimed is:

1. A capacitive stylus capable of providing signals for tilt and orientation detection on a tablet or a touch panel, comprising:
   a control circuit board on which a micro controller is mounted;
   a pin electrically connecting with the control circuit board, the micro controller instructing a first high voltage to be emitted from the pin;
   a signal-transmitting spring being separately disposed parallel to the pin and comprising a bent portion and electrically connecting with the control circuit board, the micro controller instructing a second high voltage transmitted to the signal-transmitting spring;
   a first insulating sheet covering the signal-transmitting spring and comprising a first aperture at its side wall;
   a shielding layer covering the first insulating sheet and comprising a second aperture at its side wall, the shielding layer electrically connecting with a ground of the control circuit board;
   a second insulating sheet covering the shielding layer and comprising a third aperture at its side wall; and
   a hollow cylinder-shaped signal emitter being arranged at the outside of the second insulating sheet;
   wherein the bent portion of the signal-transmitting spring passes through the first aperture, the second aperture, and the third aperture to contact the inner wall of the signal-emitter, allowing the second high voltage signal to be emitted from the signal emitter.

2. The capacitive stylus as recited in claim 1, wherein both the first insulating sheet and the second insulating sheet are made of a polymer, and the tablet or the touch panel receives the first high voltage signal and the second high voltage signal and calculates the tilt and orientation of the capacitive stylus according to the first high voltage signal and the second high voltage signal.

3. The capacitive stylus as recited in claim 1, wherein both the first insulating sheet and the second insulating sheet are Mylar sheet.

4. The capacitive stylus as recited in claim 1, wherein both the first insulating sheet and the second insulating sheet are made of polyethylene terephthalate (PET).

5. The capacitive stylus as recited in claim 1, wherein the shielding layer comprises an upper shielding layer and a lower shielding layer.

6. A capacitive stylus capable of providing signals for tilt and orientation detection on a tablet or a touch panel, comprising:
   a control circuit board on which a micro controller is mounted;
   a pin electrically connecting with the control circuit board, the micro controller instructing a first high voltage to be emitted from the pin;
   a signal-transmitting spring being separately disposed parallel to the pin and comprising a bent portion and electrically connecting with the control circuit board, the micro controller instructing a second high voltage to be transmitted to the signal-transmitting spring;
   a first insulating sheet covering the signal-transmitting spring and comprising a first aperture at its side wall;
   a shielding layer covering a portion of the first insulating sheet and electrically connecting with a ground of the control circuit board;
   a hollow cylinder-shaped signal emitter being arranged at the outside of the first insulating sheet; and
   an isolation sheet to isolate the shielding layer from the signal-emitter;
   wherein the bent portion of the signal-transmitting spring passes through the first aperture and contacts the inner wall of the signal-emitter, allowing the second high voltage signal to be emitted from the signal emitter.

7. The capacitive stylus as recited in claim 6, wherein both the first insulating sheet and the isolation sheet are made of a polymer, and the tablet or the touch panel receives the first high voltage signal and the second high voltage signal and calculates the tilt and orientation of the capacitive stylus according to the first high voltage signal and the second high voltage signal.

8. The capacitive stylus as recited in claim 6, wherein both the first insulating sheet and the isolation sheet are Mylar sheet.

9. The capacitive stylus as recited in claim 6, wherein both the first insulating sheet and the isolation sheet are made of polyethylene terephthalate (PET).

10. The capacitive stylus as recited in claim 6, wherein the shielding layer comprises an upper shielding layer and a lower shielding layer.

* * * * *